United States Patent
Schafferer et al.

(10) Patent No.: US 9,154,148 B2
(45) Date of Patent: Oct. 6, 2015

(54) CLOCK SIGNAL ERROR CORRECTION IN A DIGITAL-TO-ANALOG CONVERTER

(71) Applicant: ANALOG DEVICES, INC., Norwood, MA (US)

(72) Inventors: Bernd Schafferer, Amesbury, MA (US); Ping Wing Lai, Belmont, MA (US); Qiurong He, Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/210,304

(22) Filed: Mar. 13, 2014

(65) Prior Publication Data

US 2014/0313065 A1    Oct. 23, 2014

Related U.S. Application Data

(60) Provisional application No. 61/799,723, filed on Mar. 15, 2013.

(51) Int. Cl.
| | |
|---|---|
| H03M 1/06 | (2006.01) |
| H03M 1/10 | (2006.01) |
| G06F 1/04 | (2006.01) |
| H03M 1/66 | (2006.01) |
| H03M 1/74 | (2006.01) |

(52) U.S. Cl.
CPC .............. *H03M 1/1009* (2013.01); *G06F 1/04* (2013.01); *H03M 1/06* (2013.01); *H03M 1/0678* (2013.01); *H03M 1/66* (2013.01); *H03M 1/742* (2013.01)

(58) Field of Classification Search
CPC ....... H03K 5/13; H03K 5/131; H03K 5/1565; H03H 11/26; G06F 1/06; H04L 7/033
USPC ......... 327/159, 155, 261, 199, 208, 175, 276, 327/231, 233; 375/354, 343, 376, 355, 359, 375/371; 331/47, 74, 177 R
See application file for complete search history.

(56) References Cited

U.S. PATENT DOCUMENTS

| | | |
|---|---|---|
| 5,285,505 A | 2/1994 | Kim et al. |
| 5,490,223 A | 2/1996 | Nishimura et al. |
| 5,647,023 A | 7/1997 | Agazzi et al. |

(Continued)

FOREIGN PATENT DOCUMENTS

EP    391044    10/1990

OTHER PUBLICATIONS

European Search Report in EP Patent Application No. 14159962.1 mailed Jul. 31, 2014, 8 pages.

(Continued)

*Primary Examiner* — Lam T Mai
(74) *Attorney, Agent, or Firm* — Patent Capital Group (57) ABSTRACT

In an example, there is disclosed herein a digital-to-analog converter (DAC) including a correction circuit for a clock, including a differential clock. Error correction may take place within the DAC core, by means of replica cells that are substantially similar to conversion cells. Rather than contributing their output to the converted signal, the replica cells may be configured to provide a feedback signal to a clock receiver with information for correcting the clock signal. The feedback signal may be operable to correct errors, for example, in duty cycle and crosspoint, as measured at the DAC core.

21 Claims, 8 Drawing Sheets

(56) References Cited

U.S. PATENT DOCUMENTS

| | | | |
|---|---|---|---|
| 5,689,258 | A | 11/1997 | Yasuyuki et al. |
| 5,953,648 | A * | 9/1999 | Hutchison et al. ......... 455/343.4 |
| 6,304,140 | B1 | 10/2001 | Thron et al. |
| 6,304,517 | B1 * | 10/2001 | Ledfelt et al. .................... 368/10 |
| 6,339,399 | B1 | 1/2002 | Andersson et al. |
| 6,774,683 | B2 | 8/2004 | Schafferer |
| 6,798,251 | B1 | 9/2004 | Schafferer |
| 6,973,138 | B1 | 12/2005 | Wright |
| 6,981,185 | B1 | 12/2005 | Davis et al. |
| 7,138,790 | B2 * | 11/2006 | Hackner et al. ............... 323/282 |
| 7,545,194 | B2 * | 6/2009 | Chen et al. .................... 327/276 |
| 7,570,188 | B2 | 8/2009 | Marais |
| 7,679,538 | B2 | 3/2010 | Tsang |
| 7,701,373 | B2 | 4/2010 | Tokumaru et al. |
| 7,801,870 | B2 * | 9/2010 | Oh et al. ....................... 707/695 |
| 7,835,699 | B2 * | 11/2010 | Park ............................ 455/63.1 |
| 7,847,717 | B2 | 12/2010 | Mishra et al. |
| 7,898,446 | B2 * | 3/2011 | Nagarajan et al. ............ 341/118 |
| 7,903,016 | B1 | 3/2011 | Wyatt |
| 7,978,572 | B2 * | 7/2011 | Nagai ........................... 369/47.3 |
| 8,009,095 | B2 | 8/2011 | Schlee et al. |
| 8,031,098 | B1 | 10/2011 | Christian et al. |
| 8,194,811 | B2 * | 6/2012 | Song et al. .................... 375/355 |
| 8,284,860 | B2 | 10/2012 | Xu et al. |
| 8,351,877 | B2 | 1/2013 | Kim et al. |
| 8,417,200 | B1 | 4/2013 | Gomez et al. |
| 8,618,969 | B2 | 12/2013 | Wyville |
| 8,885,763 | B2 | 11/2014 | Ananthaswamy |
| 2002/0048326 | A1 | 4/2002 | Sahlman |
| 2010/0328124 | A1 | 12/2010 | O'Donnell et al. |

OTHER PUBLICATIONS

Response to European Search Report in EP Patent Application Serial No. 14159962.1 filed Mar. 4, 2015, 11 pages.

Blog, D1 I/V with 4x TDA1543, http://www.diyaudio.com/forums/pass-labs/196937-d1-i-v-4x-tda1543.html, Pass Labs, Sep. 20, 2011, 4 pages.

Blog, The Pass D1 for TDA1543, http://www.diyaudio.com/forums/digital-line-level/32999-pass-d1-tda15 . . . , Digital Line Level, DACs, Digital Crossovers, Equalizers, etc., Apr. 26, 2004, 6 pages.

Adams, R. "A 3V CMOS 400mW 14b 1.4GS/s DAC for Multi-Carrier Applications", Solid-State Circuits Conference, 2004, Digest of Technical Papers, ISSCC, 2004 IEEE International, Feb. 15-19, 2004, vol. 1, pp. 360-532 (172).

AD9734/AD9735/AD9736—Analog Devices Data Sheet—Oct. 12, 2014-Bit, 1200 MSPS DACS, Rev. A, © 2006 Analog Devices, Inc., 72 pages.

DARPA, Broad Agency Announcement, Direct Digital to High Power Analog Conversion Technology (PowerDAC), DARPA Microsystems Technology Office (MTO), DARPA-BAA-11-12, Jan. 13, 2011, 46 pages.

Patent Abstracts of Japan, vol. 14, No. 494, Japan (P-1123), Oct. 26, 1990 & JP-A-02-202689 (Fujitsu Ltd) Aug. 10, 1990, abstract. 1 page.

Patent Abstracts of Japan, vol. 15. No. 368 (P1235). Japan Sep. 17, 1991 & .TP-A-O3 144788 (Nee Corp) Jun. 20, 1991, abstract, 1 page.

Ajay Kuckreja, "Digital RF Modulators for CCAP," Aug. 20, 2012, www.cedmagazine.com/articles/2012/08/digital-rf-modulators-for-ccap, May 7, 2015, 5 pages.

Dong-U Lee et al., "Hierarchical Segmentation for Hardware Function Evaluation," IEEE Transactions on Very Large Scale Integration (VLSI) Systems, vol. 17, No. 1, Jan. 2009, 1063-8210/$25.00 © 2008 IEEE, pp. 103-116 (14 pages).

Tsutomu Sasao et al., "Numerical Function Generators Using LUT Cascades," IEEE Transactions on Computers, vol. 56, No. 6, Jun. 2007, 0018-9340/07/$25.00 © 2007 IEEE, Published by the IEEE Computer Society, pp. 826-838 (14 pages).

* cited by examiner

CLOCK SIGNAL ERROR CORRECTION IN A DIGITAL-TO-ANALOG CONVERTER

CROSS REFERENCE TO RELATED APPLICATIONS

This application claims priority to U.S. Provisional Application 61/799,723, entitled "Duty Cycle Detection Circuit for Double Data Rate Conversion," filed Mar. 15, 2013, which is incorporated herein by reference in its entirety.

FIELD OF THE DISCLOSURE

This application relates to the field of signal processing, and more particularly to a clock signal error correction circuit in a digital-to-analog converter.

BACKGROUND

Signal processing circuits such as digital-to-analog converters may need to be clocked to ensure that data outputs are properly synchronized. In some cases, feedback circuits are used to correct errors in clock signal parameters, including for example duty cycle and crosspoint.

A current-steering DAC is configured to convert a n-bit digital input signal using an array of n binary weighted switches. The switching mechanism enables currents to be provided to a current combination network. For example, where n=4, the currents are $$I, \frac{I}{2}, \frac{I}{4}, \text{ and } \frac{I}{8}$$

(weighted to the binary digital input). The sum/aggregation of the currents provided by the switches forms the analog representation of the digital input signal in the form of a current output.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE EMBODIMENTS

Overview

In an example, there is disclosed herein a digital-to-analog converter (DAC) including a correction circuit for a clock, including a differential clock. Error correction may take place within the DAC core, by means of replica cells that are substantially similar to conversion cells. Rather than contributing their output to the converted signal, the replica cells may be configured to provide a feedback signal to a clock receiver with information for correcting the clock signal. The feedback signal may be operable to correct errors, for example, in duty cycle and crosspoint, as measured at the DAC core.

In a first example embodiment, there is disclosed a digital-to-analog converter (DAC) comprising a clock receiver operable to provide a distributed clock signal output and operable to adjust the distributed clock signal responsive to a feedback signal; and a DAC core operable to receive the distributed clock signal and to provide the distributed clock signal to a plurality of conversion cells, the DAC core comprising a clock error detection circuit operable to detect a first species of error in the distributed clock signal.

In a second example embodiment, there is disclosed a clock signal error detector comprising an input for receiving a clock signal input; an error detection core circuit operable to detect a first species of error in the clock signal input; and an output for providing a clock correction signal; wherein the clock signal error detector is disposed within a data conversion core and comprises circuitry that is a substantial clone of a substantive data conversion circuit within the data conversion core.

In a third example embodiment, there is disclosed a method of providing a corrected clock signal comprising generating an output clock signal; distributing the output clock signal to a plurality of conversion cells within a data conversion core; detecting, within the data conversion core, errors in the clock signal; and providing a feedback signal to correct the output clock signal.

Example Embodiments Of The Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiment many have different advantages, and no particular advantage is necessarily required of any embodiment.

In a double data rate digital to analog converter (DAC), duty cycle distortion may create undesirable variations, such as $nF_s \pm f_{out}$ spurs, (where n is an integer). Duty cycle distortion may be contributed, among other things, by clock path mismatch and current steering cells. Thus, it is desirable to measure the total duty cycle distortion generated by the whole clock path and a current steering cell. The distortion can then be corrected at the clock receiver.

Another issue faced in some embodiments is crosspoint skew in differential clock signals. The "crosspoint" in a differential signal, such as a low-voltage differential signaling (LVDS) clock is the point where a rising edge of one side of the differential signal crosses the falling edge of the other side of the differential signal. A theoretically "ideal" crosspoint may be selected based on design parameters, including the point where the common source node has minimum ripple. In some embodiments, the theoretically ideal crosspoint may occur when the signals cross a zero reference, however many other points may be chosen. For example, in an NMOS DAC core, the theoretically ideal crosspoint may be above the zero reference, while in a PMOS DAC core, the theoretically ideal crosspoint may be below the zero reference. But skewing can shift the crosspoint away from its theoretically ideal value.

In certain existing technologies, the input of the duty cycle detection circuit is tapped at input of the switching current cell. This method cannot measure the duty cycle distortion due to the switching cell itself.

Additional details of the present Specification are best appreciated with reference to the attached FIGURES. Throughout the figures, certain terms are used by way of example only, and should be understood in that context. For example, certain example circuits may include a positive node V$^+$ and a negative node V$^-$. Nodes V$^+$ and V$^-$ both have many possible values. By convention, V$^+$ is spoken of as being the most "positive" voltage and V$^-$ is spoken of as being the most "negative" voltage. Thus, under appropriate circumstances, either V$^+$ or V$^-$ could be considered a "supply" or "positive" voltage, and under other circumstances, either V$^+$ or V$^-$ could be considered a "ground," "negative," or "negative supply" voltage. It should be noted that V$^-$ need be neither an absolute ground ("earth" or "chassis"), nor necessarily negative with respect to earth or chassis ground. Furthermore, "positive" and "negative" may be understood to refer simply to two opposite sides of a difference in potential. Thus, where a signal has a "positive side" and a "negative side," this may be construed generally to mean that the positive side of the signal includes those portions above a reference voltage, while the negative side of the signal includes those portions below the reference voltage. In some embodiments, a zero point is defined at earth ground or chassis ground and V$^+$ and V$^-$ may have values of substantially the same magnitude but opposite sign.

This Specification may also make reference to certain transconductors. As used throughout this Specification, a "transconductor" any non-passive devices with three or more nodes configured to provide a transconductance or transconductance effect, characterized for example by $$g_m = \frac{\Delta I_{out}}{\Delta V_{in}}$$

or $$g_m = \frac{i_{out}}{v_{in}}.$$

Transconductors include any solid-state transistors, including bipolar junction transistors (BJT), field-effect transistors (FETs), metal-oxide FETs (MOSFETs), junction FETs (JFETs), triodes, vacuum tubes, current-to-voltage converters, voltage-to-current converters, and amplifiers by way of non-limiting example. For ease of reference, all such devices are referred to herein generically as transconductors. In general, a transconductor will have at least three nodes, which can be referred to as a first node (base, gate, or similar), second node (source, emitter, or similar), and third node (drain, collector, or similar). In many disclosed examples, one type of transistor, such as a "p-type" transistor, may be trivially substituted for another transistor, such as an "n-type" transistor by rearranging polarities in a circuit design. Thus, unless expressly stated otherwise, it is intended herein that, for example, a design employing an n-type MOSFET be considered the equivalent of a similar design employing an npn-type BJT with appropriate modifications.

Figure 1:
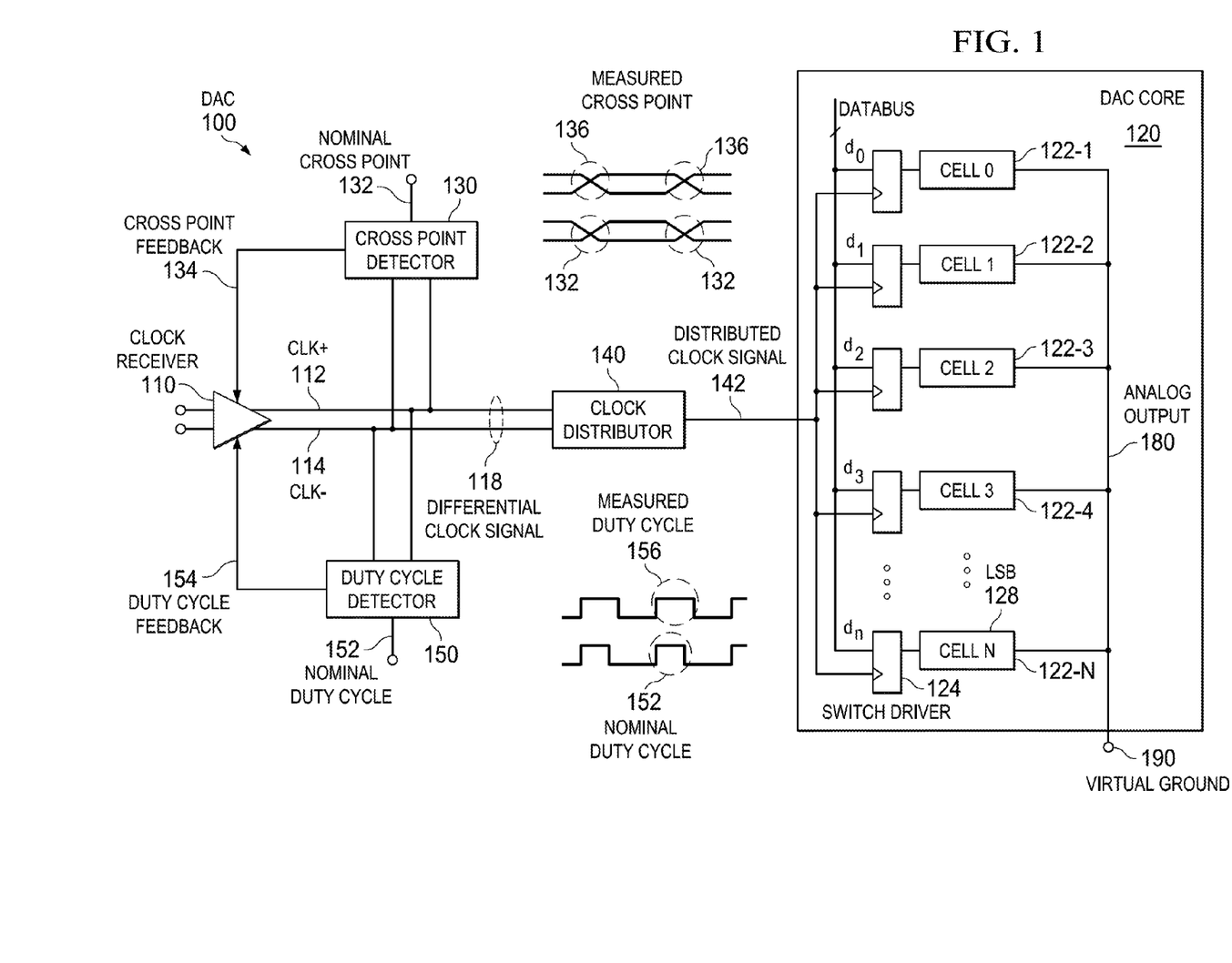
FIG. 1 is a block diagram of a digital-to-analog converter (DAC) according to one or more examples of the present Specification.

FIG. 1 is a block diagram of an example DAC 100 according to one or more examples of the present Specification. DAC 100 includes a clock receiver 110 and a core 120. Clock receiver 110 is configured to provide a clock signal 118 to core 120.

Clock receiver 110 is configured to receive a clock input signal and to provide a differential clock signal 118 comprising CLK+ 112 and CLK− 114. Clock receiver 110 may include any clock conditioning circuit. It should also be noted that a differential clock signal 118 is provided by way of example only, and in certain embodiments, a ground-reference or other clock signal may also be provided. Clock receiver 110 provides differential clock signal 118 to clock distributor 140.

Clock distributor 140 is configured to distribute clock signal 118 to a plurality of conversion cells 122 within DAC core 120. Clock distributor 140 may include any circuit or electrical or electronic network operable to receive clock signal 118 and to provide clock signal 118 to a plurality of destination circuits. In an example, each cell 122 receives an identical copy of the distributed clock signal 142. However, it is recognized that clock receiver 110 may introduce deviations and errors from an ideal differential clock signal 118. So duty cycle detector 150 and crosspoint detector 130 are provided in a feedback configuration with clock receiver 110. In an example, duty cycle detector 150 receives CLK+ 112 and CLK− 114 and measures a difference between measured duty cycle 156 of differential clock signal 118 and a reference nominal duty cycle 152. Duty cycle detector 150 may provide a duty cycle feedback 154 to clock receiver 110. It should be noted that although nominal duty cycle 152 is disclosed herein as a an input signal to duty cycle detector 150, in some embodiments, nominal duty cycle 152 may be provided internal to duty cycle detector 150, or may otherwise be encoded within duty cycle detector 150. For example, duty cycle detector 150 may have an internal inverter configured to generate a signal complementary to CLK+ 112 and CLK− 114. This complementary signal may have a duty cycle distortion error opposite to CLK+ 112 and CLK− 114. Thus, it should be recognized that nominal clock 152 is disclosed as an input by way of example only, and other configurations are possible. Duty cycle detector 150 provides duty cycle feedback signal 154 to clock receiver 110. Clock receiver 110 may subtract duty cycle feedback 154 from differential clock signal 118 to provide a corrected differential clock signal 118.

Crosspoint detector 130 also receives differential clock signal 118, including CLK+ 112 and CLK− 114. A nominal crosspoint input 132 is also provided. It should be noted, however, that nominal crosspoint 132 is provided as an input signal by way of example only. In some examples, a nominal crosspoint 132 may be programmed internally to crosspoint detector 130. For example, use of the complementary signal described above as a "nominal cross point" may generate a cross point feedback with twice as much feedback signal. Thus, the disclosure of nominal crosspoint 132 as a separate input signal is provided herein by way of example only to facilitate discussion. Crosspoint detector 130 measures a difference between nominal crosspoint 132 and measured crosspoint 136, providing a crosspoint feedback signal 134. Clock receiver 110 receives crosspoint feedback 134 and may subtract crosspoint feedback 134 from differential clock signal 118, thus providing a corrected differential clock signal 18. In this manner, differential clock signal 118 is more accurate than it would be without the feedback provided by duty cycle detector 150 and crosspoint detector 130.

Clock distributor 140 provides distributed clock signal 142 to 120. Core 120 includes a plurality of conversion cells 122-1 through 122-N. In some embodiments, each cell 122 is identical to each other cell 122. However, in other embodied its, cells 122 need not be identical. For example, in some embodiments, cells 122 may be of two separate species, and divided into two separate subgroups. It should also be noted that in some embodiments, the number of cells 122 correspond one-to-one with the number of bits of resolution for core 120. In other embodiments, however, core 120 may include a number of cells 122 that are different from the number of bits of resolution. For example, in one embodiment, up to 42 cells 122 are provided for 16 bits of resolution.

Each switch driver 124 may be configured to sample the data input 1 . . . dn and feed it into each cell 122. Each cell 122 provides a portion of an analog output 180. Thus, in an example, each cell 122 contributes its output current to analog output 180, with the currents summed at virtual ground 190. In some cases, certain cells may be designated as most significant bit (MSB) cells 126, while other cells are designated as least significant bit (LSB) cells 128. For example, in an embodiment with 16 bits of resolution, at least 16 cells 122 are provided. Cell 122-1 may be designated as MSB cell 126. In another embodiment, more than 16 cells 122 are provided, and more than one cell may be designated as MSB cell 126, so that multiple cells contribute to the value of MSB 126. Cell 122-N contributes the least significant bit LSB 128 of the analog output 180.

Figure 2:
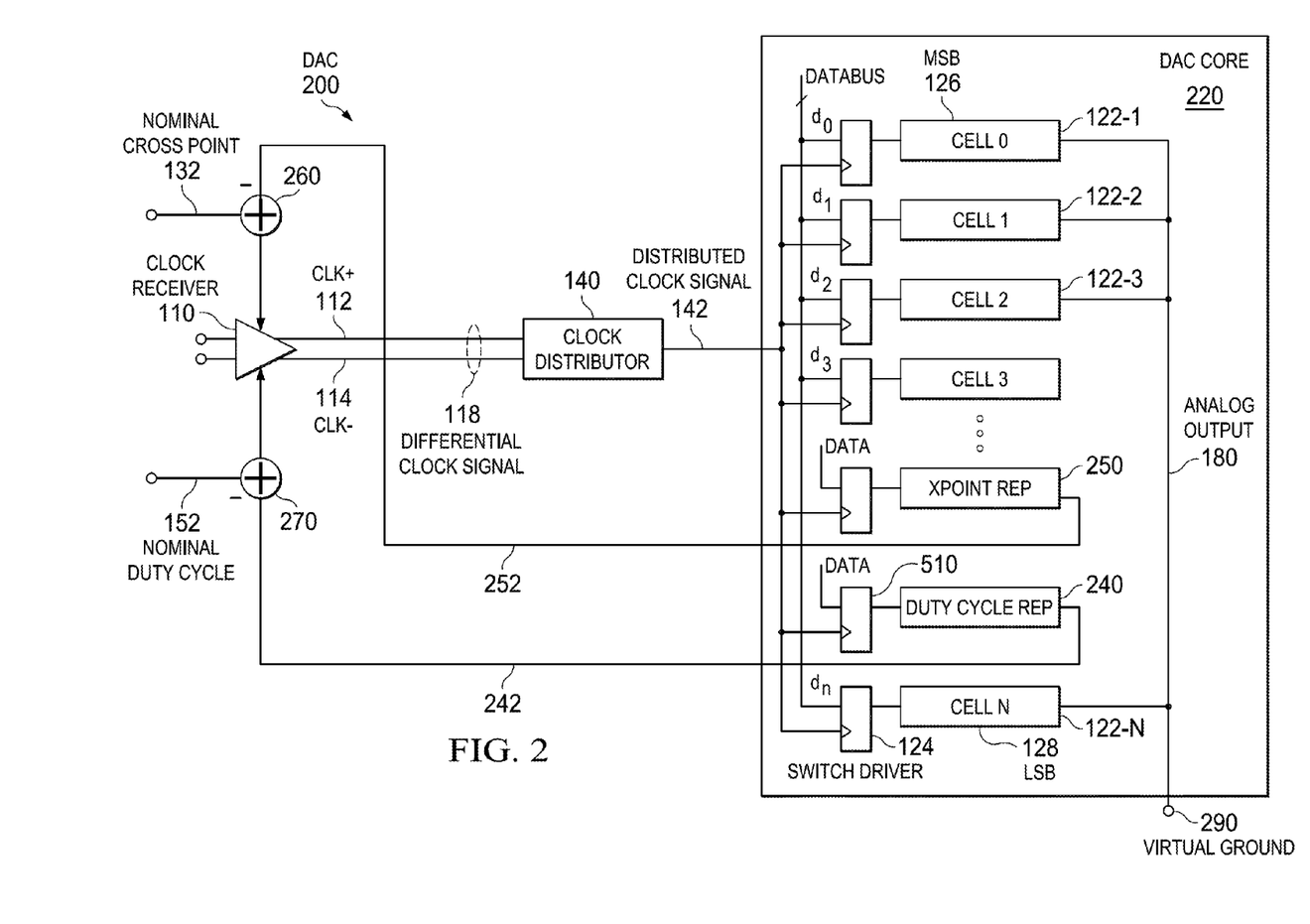
FIG. 2 is a block diagram of a second DAC according to one or more examples of the present Specification.

FIG. 2 is a block diagram of a second DAC 200 according to one or more examples of the present Specification. In some embodiments, DAC 200 may realize certain advantages over DAC 100. For example, because DAC 100 places crosspoint detector 130 and duty cycle detector 150 in a feedback configuration before differential clock signal 118 has been distributed by clock distributor 140, disturbances and perturbations that that occur within clock distributor 140, and within DAC 120 are not captured by crosspoint detector 130 and duty cycle detector 150. This may limit the viability of duty cycle feedback 154 and crosspoint feedback 134 in accurately correcting differential clock signal 118.

To help ensure accurate feedback measurements, DAC core 220 advantageously provides a novel feedback configuration within DAC core 220.

As with DAC 100, DAC 200 includes a clock receiver 110, a clock distributor 140 receiving a differential clock signal 118 from clock receiver 110, and a DAC core 220 receiving a distributed clock signal 142 from clock distributor 140. As with DAC core 120, DAC core 220 includes a switch driver 124 for each of the plurality of cells 122, numbered 122-1 through 122-N. DAC core 220 also includes one or more MSB cells 126 and LSB cells 128. Cells 122 provide analog outputs 180, which are summed at virtual ground 290.

DAC 200 does not include an external crosspoint detector 130 and duty cycle detector 150. Instead, DAC core 220 includes a replica cell called a duty cycle replica 240, and a replica cell called a crosspoint replica 250. Duty cycle replica 240 receives distributed clock signal 142 via a switch driver 124, similar to the plurality of cells 122. Crosspoint replica 250 also receives distributed clock signal 142 via a switch driver 124, similar to the plurality of cells 122. However, duty cycle replica 240 and crosspoint replica 250 do not contribute their output values to analog output 180.

Duty cycle replica 240 receives a DATA input 510 and provides duty cycle output 242 to adding device 270. Adding device 270 also receives nominal duty cycle 152. Thus, adding device 270 calculates a difference between nominal duty cycle 152 and the output of duty cycle replica 240. Adding device 270 provides this back to clock receiver 110 for feedback purposes.

Similarly, crosspoint replica 250 also receives a DATA input 510 and provides crosspoint output 252 to adding device 260. Adding device 260 is also configured to receive as an input nominal crosspoint 132. Thus, adding device 260 is configured to calculate a difference between nominal crosspoint 132 and the measured crosspoint of crosspoint replica 250. Adding device 260 provides this difference as a correction signal to clock receiver 110. Thus, clock receiver 110 may correct differential clock signal 118 for deviations in both the crosspoint and duty cycle. Differential clock signal 118 may therefore account for both the correction signal from adding device 260 and the correction signal from adding device 270. Thus, differential clock signal 118 may be substantially more accurately refined than it is in the embodiment of DAC 100 of FIG. 1. This is because deviations in the crosspoint and duty cycle are measured at the same point where they are experienced by cells 122.

Figure 3:
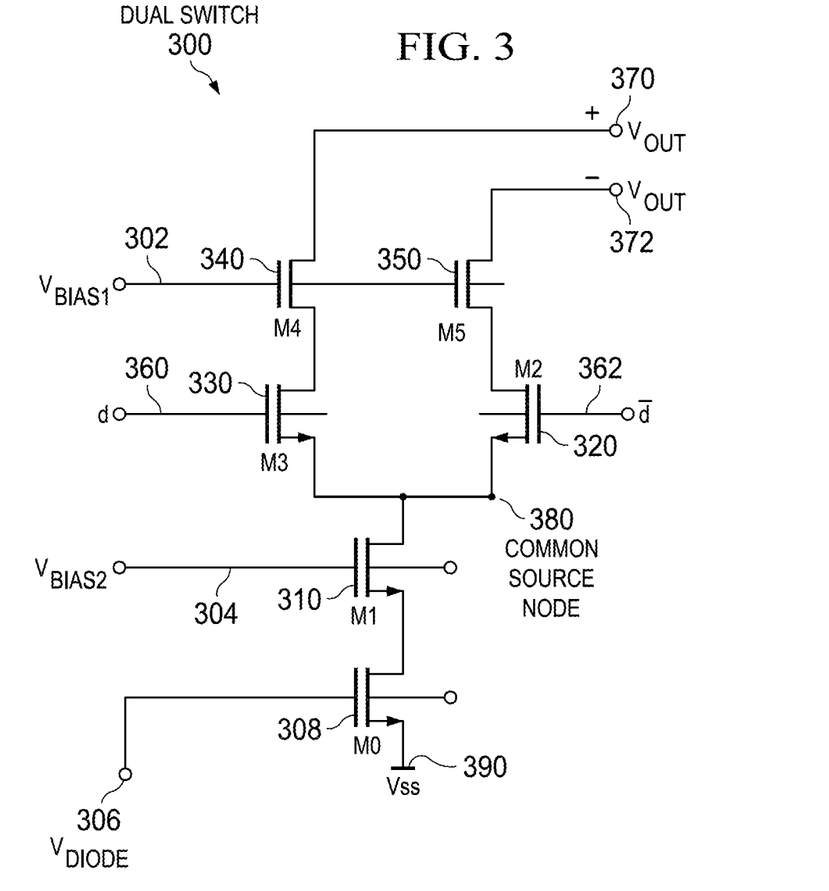
FIG. 3 is a block diagram is an electrical schematic of a dual switch according to one or more examples of the present Specification.
Figure 4:
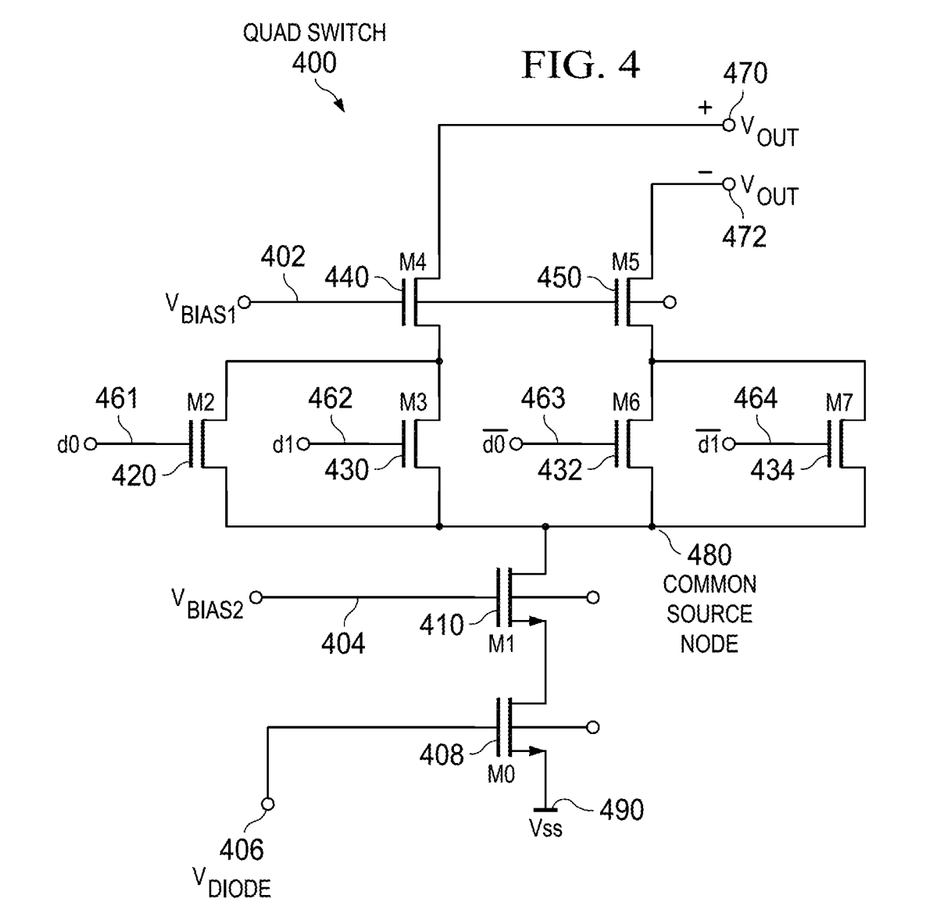
FIG. 4 is a block diagram of a quad switch according to one or more examples of the present Specification.

FIG. 3 is a block diagram of a dual switch network 300 according to one or more examples of the present Specification. In this configuration, dual switch 300 may be an example of a cell 122 of DAC 100 or DAC 200. However, it should be noted that dual switch 300 is disclosed by way of example only, and other configurations are possible. For example, FIG. 4 discloses a quad switch 400, among many other possibilities. As noted above, although dual switch 300 and quad switch 400 of FIG. 4 are disclosed by way of example as n-type MOSFET transconductors, the design can be trivially interchanged with a p-type MOSFET transconductor or other similar transconductor.

Dual switch 300 comprises a plurality of transconductors "M." Transconductors M0 308 and M1 310 are referenced to $V_{SS}$ node 390. $V_{SS}$ node 390 is configured as a "negative" node in this example. Transconductor M0 308 includes a $V_{diode}$ 306 at its gate node and is configured as part of a current mirror and may provide current for each switching cell, such as cells 122 of DAC 100. Transconductor M1 310 has a $V_{bias}$ 304 at its gate node and is an optional cascode device that may be placed to improve the output impedance of the current mirror.

Transconductors M2 320 and M3 330 comprise a data conversion stage. Transconductor M3 330 receives data input d 360 at its gate node. Transconductor M2 320 receives at its gate node data signal $\bar{d}$ 362, wherein data signal $\bar{d}$ represents the inverse of data signal d. The source nodes of transconductors M2 320 and M3 330 are shorted together into a common source node 380, which may be significant for performance considerations, and which, as noted above, may be used in providing nominal crosspoint 132 and nominal duty cycle 152.

The drain nodes of M2 320 and M3 330 are configured to act as output nodes, providing a differential signal comprising $V_{out}^+$ 370 and $V_{out}^-$ 372. It should be noted that although these outputs are shown as respective voltages to facilitate discussion, in the example disclosed, meaningful information is stored instead in the respective output currents. Thus, to convert the output currents to usable voltages, the currents may be provided, for example, to a resistance termination stage, current-to-voltage converter stage, or similar.

Transconductors M4 340 and M5 350 may be disposed at the output drain nodes of M3 330 and M2 320 respectively to act as respective cascade stages. Each of transconductors M4 340 and M5 350 are biased at the gate node by a $V_{bias}$ 302. Transconductors M4 340 and M5 350 may be provided as necessary according to design considerations in one or more embodiments, but may be unnecessary in other embodiments.

FIG. 4 is a block diagram of a quad switch 400 according to one or more examples of the present Specification. In some configurations, quad switch 400 may be used as an embodiment of cells 122 of FIG. 1. In contrast to dual switch 300 of FIG. 3, quad switch 400 is configured to receive two bits of differential input.

Like dual 4063 switch 300 of FIG. 3, quad switch 400 includes a current mirror stage comprising transconductor M0 408, along with optional transconductor M1 410. Where necessary for performance considerations, transconductor M1 410 is biased by a bias voltage $V_{bias2}$ 404 to provide extra output impedance for the current mirror.

The data conversion stage of quad switch 400 comprises four transconductors, namely transconductor M2 420, transconductor M3 430, transconductor M6 432, and transconductor M7 434, which are referred to collectively herein as "data conversion transconductors." The data conversion transconductors have their source nodes shorted together at a "common source node" 480, which is similar to common source node 380 of FIG. 3. Each data conversion transconductor also has a data input at its gate node.

Specifically, transconductor M2 420 receives at its gate node data input $d_0$ 461. Transconductor M3 430 receives at its gate node data signal $d_1$ 462. Transconductor M6 432 receives at its gate node data input $\bar{d}_0$ 463. Transconductor M7 434 receives at its gate node data signal $\bar{d}_1$ 464. In an example, $d_0$ and $\bar{d}_0$ are complementary parts of a differential data signal. Similarly, d1 and $\bar{d}_1$ are complementary parts of a second differential data signal. All four signals comprise a quadrature datum, with $d_1$ lagging $d_0$ by half a clock cycle.

Transconductors M2 420 and M3 430 may be said to comprise a positive-side data input stage, while transconductors M6 432 and M7 434 may be said to comprise a negative-side data input stage. Thus, transconductors M2 420 and M3 430 are tied together at the respective drain nodes to provide a positive-side output. Similarly, transconductors M6 432 and M7 434 are tied together at their respective drain nodes to provide a negative-side output. In this configuration, each transconductor contributes a respective current, which currents are added at the respective drain nodes.

As with dual switch 300 of FIG. 3, quad switch 400 of FIG. 4 includes two transconductors acting as an optional cascode stage. Specifically, transconductor M4 440 receives a bias voltage $V_{bias}$ 402 at its gate node, and is configured to act as a cascode stage for positive-side data input transconductors M2 420 and M3 430. Transconductor M5 450 also receives at its gate node biasing voltage be $V_{bias}$ 402, and is configured to act as a cascode stage for negative-side data input transconductors M6 432 and M7 434. Transconductor M4 440 provides at its drain node an output current, $I_{out}^+$ which may be converted to an output voltage $V_{out}^+$ 470. Transconductor M5 450 provides at its drain node an output current $I_{out}^-$, which may be converted to an output voltage $V_{out}^-$ 472. As with dual switch 300, the outputs may be provided to resistive load, current-to-voltage converter, or similar.

Figure 5:
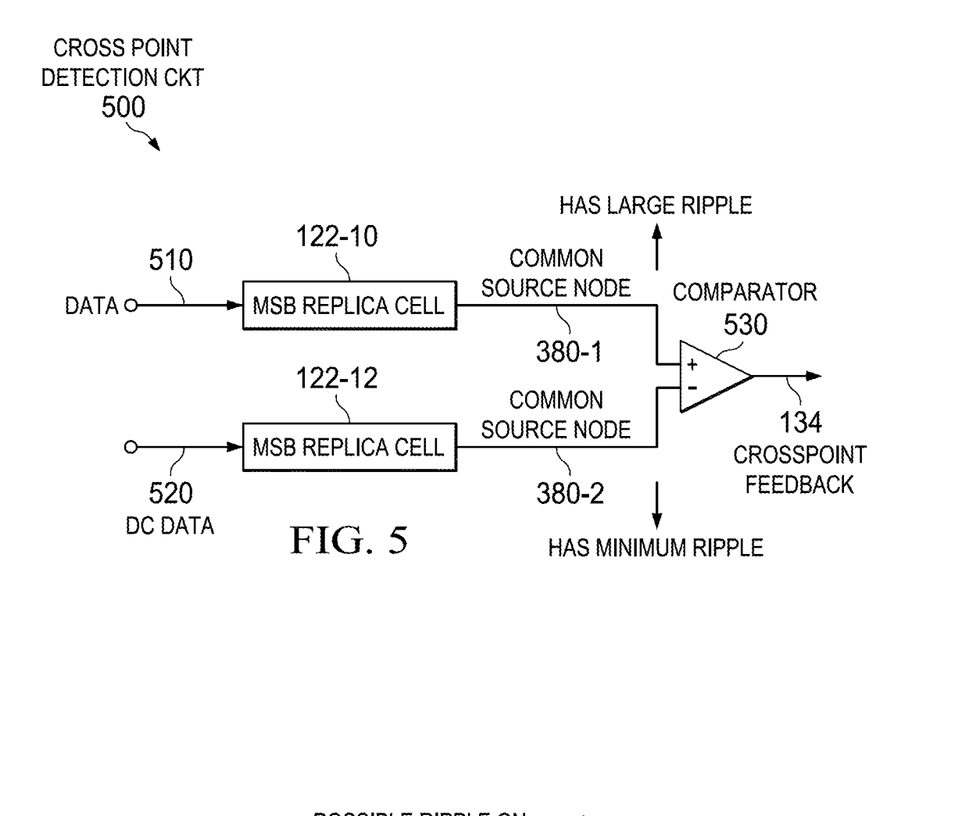
FIG. 5 is a block diagram of a cross point detection circuit according to one or more examples of the present Specification.

FIG. 5 is a block diagram of a crosspoint detection circuit 500 according to one or more examples of the present Specification. In some embodiments, crosspoint detection circuit 500 may be an embodiment of crosspoint detector 130 of FIG. 1, or of crosspoint replica 250 of FIG. 2. It should be noted however that crosspoint detection circuit 500 is provided by way of example only, and is not intended to be limiting, either of crosspoint detector 130 of FIG. 1 or crosspoint replica 250 of FIG. 2.

In one embodiment, crosspoint detection circuit 500 includes two MSB replica cells, 122-10 and 122-12. MSB replica cell 122-10 receives a real data input 510, which may be for example $d_0$, $\bar{d}_0$ of dual switch 300 or $d_0$, $\bar{d}_0$, $d_1$, $\bar{d}_1$ of quad switch 400. MSB replica cell 122-10 receives real data input 510 and a crosspoint ripple is measured at common source node 380. In this example, the common source node of MSB replica cell 122-10 is referred to as common source node 380-1. It should be noted, however, that common source node 380 may also be common source node 480 in a case where a quad switch 400 of FIG. 4 is used instead of a dual switch 300 of FIG. 3. It will also be recognized that other configurations are possible. Common source node 380-1 has a relatively large ripple in its output.

A second MSB replica cell 122-12 is also provided. MSB replica cell 122-12 receives a DC data input 520. DC data input 520 may be for example logical zeros and/or logical ones, and may remain in a substantially fixed state. MSB replica cell 122-12 also has a common source node 380-2, which may be substantially similar to common source node 380-1. The output on common source node 380-2 has minimal ripple compared to common source node 380-1, because common source node 380-2 is driven by a DC data input 520, and thus does not incur any switching ripple. Common source node 380-2 and common source node 380-1 are provided to a comparator 530. Comparator 530 compares ripple on node 380-1 to ripple on node 380-2 and calculates a difference between them. The output of comparator 530 may be used as crosspoint feedback 134. In other embodiments, crosspoint feedback 134 need not be directly provided as a feedback signal to clock receiver 110. Rather, a digital output may be provided to an external monitoring system, controller, or device for monitoring purposes, and the monitoring device may be used to configure a configurable open-loop output adjustment for clock receiver 110. It should also be recognized that many other configurations are possible, and that many additional uses for crosspoint feedback 134 are available.

Figure 6:
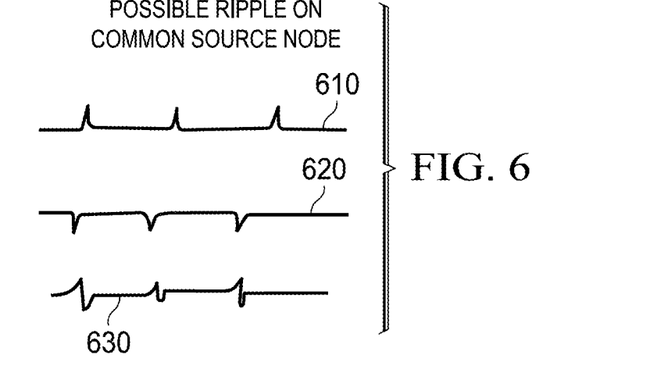
FIG. 6 is a waveform plot of a common source node ripple according to one or more examples of the present Specification.

FIG. 6 is a time-domain schematic of example ripples 610, 620, 630 that may be observed on common source nodes 380 or 480 according to one or more examples of the present Specification. During data transition, the signal on the common source node 380 may generate ripple. The magnitude and time constants (how fast the reaches to steady status) will affect DAC 100 performance. Device process and devices size used in the design will largely determine the ripple size/shape. This ripple is difficult to control at design time. However, having a correct cross point may minimize ripple.

Figure 7:
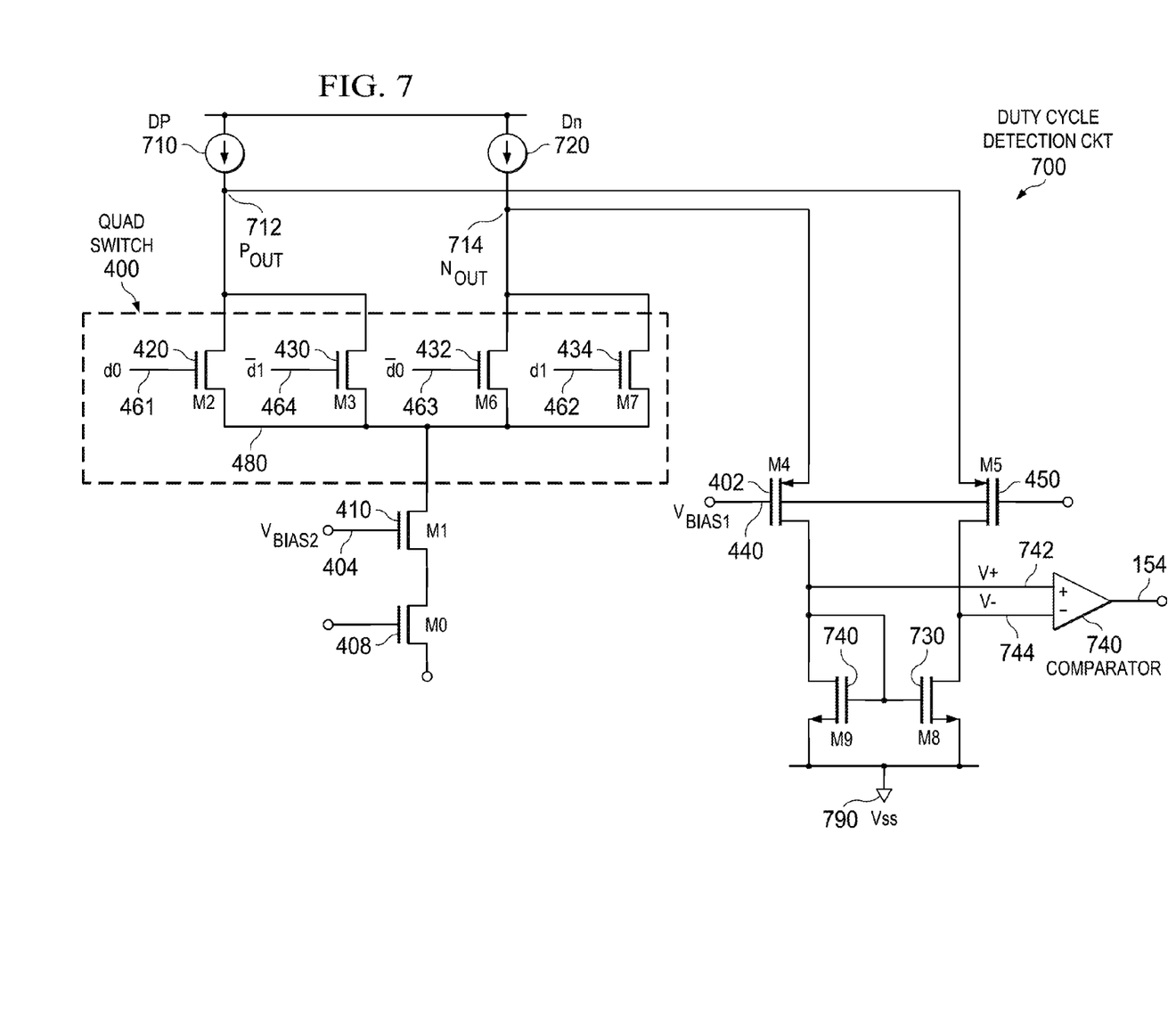
FIG. 7 is a schematic of a duty cycle detection circuit according to one or more examples of the present Specification.

FIG. 7 is a block diagram of a duty cycle detection circuit 700 according to one or more examples of the present Specification. Duty cycle detection circuit 700 includes a replica quad switch 400, which is substantially similar to quad switch 400 of FIG. 4. Thus, in some cases, duty cycle detection circuit 700 may be an embodiment of duty cycle detector 150 of FIG. 1, or an embodiment of duty cycle replica 240 of FIG. 2. Quad switch 400 of FIG. 7 includes transconductors M0 408 and M1 410, which serve substantially the same purpose as transconductors M0 408 and M1 410 of FIG. 4.

Quad switch 400 also includes four data conversion transconductors, transconductor M2 420, transconductor M3 430, transconductor M6 432, and transconductor M7 434. Like the data conversion transconductors of FIG. 4, these four transconductors have their source nodes tied together at a common source node 480. Furthermore, the data conversion transconductors are divided into two groups of two transconductors each, with the two transconductors of each group tied together at the drain node. However, to facilitate the duty cycle detection purpose of duty cycle detection circuit 700, the data inputs are configured differently from those of quad switch 400 of FIG. 4. Specifically, transconductor M2 420 receives data input $d_0$. Transconductor M3 430 receives data input $\bar{d}_1$. The outputs of these two transconductors are tied together at their respective drain nodes. Likewise, transconductor M6 432 receives data input $\bar{d}_0$, while transconductor M7 434 receives data input $d_1$. These two transconductors are also tied together at their respective drain nodes.

The drain nodes of transconductors M2 420 and M3 430 form a combined positive output $P_{out}$ 712. The drain nodes of transconductors M6 432 and M7 434 form a combined negative output $N_{out}$ 714. In this example, $P_{out}$ 712 represents a positive side of a differential output, while N_out 714 represents a negative side of the differential output. $P_{out}$ node 712 is driven by current source $D_P$ 710 to provide a constant input current, while negative output node $N_{out}$ 714 is driven by a current source $D_N$ 720. In an example, the current in $D_P$ 710 is the same as that of $D_N$ 720, which is slightly larger than the current in M0 408. Depending on the data, the current in M0 408 may switch into the $P_{out}$ node 712 or $N_{out}$ node 714. The different between $D_P$ 710 and $P_{out}$ 712 is fed into the source node of M4 440. Similarly the difference in current between $D_N$ 720 $N_{out}$ 714 is fed into the source node M5 450.

In this example, $P_{out}$ node 712 is tied to a source node of transconductor M4 440, which is biased at its gate with $V_{bias1}$ 402. Negative output node $N_{out}$ 714 is tied to a source node of transconductor M5 450, which also is biased at its gate node by $V_{bias1}$ 402. The drain nodes of transconductors M4 440 and M5 450 drive, respectively, drain nodes M9 740 and M8 730. Transconductors M9 740 and M8 730 are configured as a current mirror, forcing the same current in their respective drain nodes. Thus, the input current into V+ 742 and V− 744 respectively are the differences calculated for $P_{out}$ 712 and $N_{out}$ 714. The respective sources of transconductors M9 740 and M8 730 are both tied to a $V_{SS}$ 790, which in some embodiments may be electrically the same node as $V_{SS}$ 390 of FIG. 3 and $V_{SS}$ 490 of FIG. 4.

The electrical node connecting the drain of M4 440 and the drain of M9 740 is referred to herein as V+ 742. The electrical node connecting the drain of M5 450 and transconductor M8 730 is called herein V−744. Comparator 740 receives V+ 742 and V−744 and compares the two inputs. In an example, V−744 may be an embodiment of nominal duty cycle 152. Similarly, node V+ 742 may be an embodiment of duty cycle output 252. Thus, comparator 740 compares nominal duty cycle 152 to duty cycle output 252 and provides a differential output, which may be an example an embodiment of duty cycle feedback signal 154.

Figure 8:
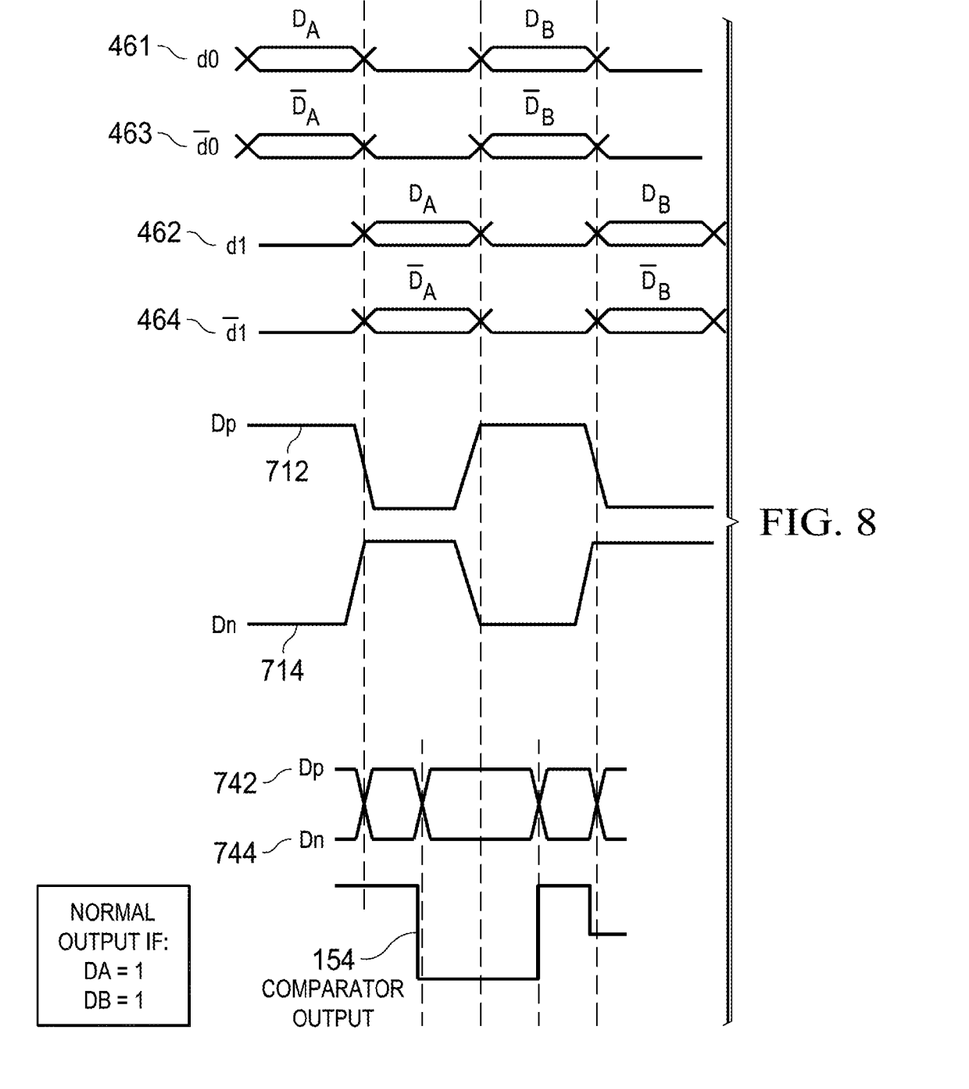
FIG. 8 is a waveform plot according to one or more examples of the present Specification.

FIG. 8 is a timing chart disclosing inputs and outputs of duty cycle detection circuit 700. Represented in this diagram are input signals $d_0$ 461, $\bar{d}_0$ 463, $d_1$ 462, and $\bar{d}_1$ 464. The remaining waveforms disclosed in FIG. 8 track one-for-one to the corresponding nodes in FIG. 7, illustrating the operation described above with respect to FIG. 7.

Figure 9:
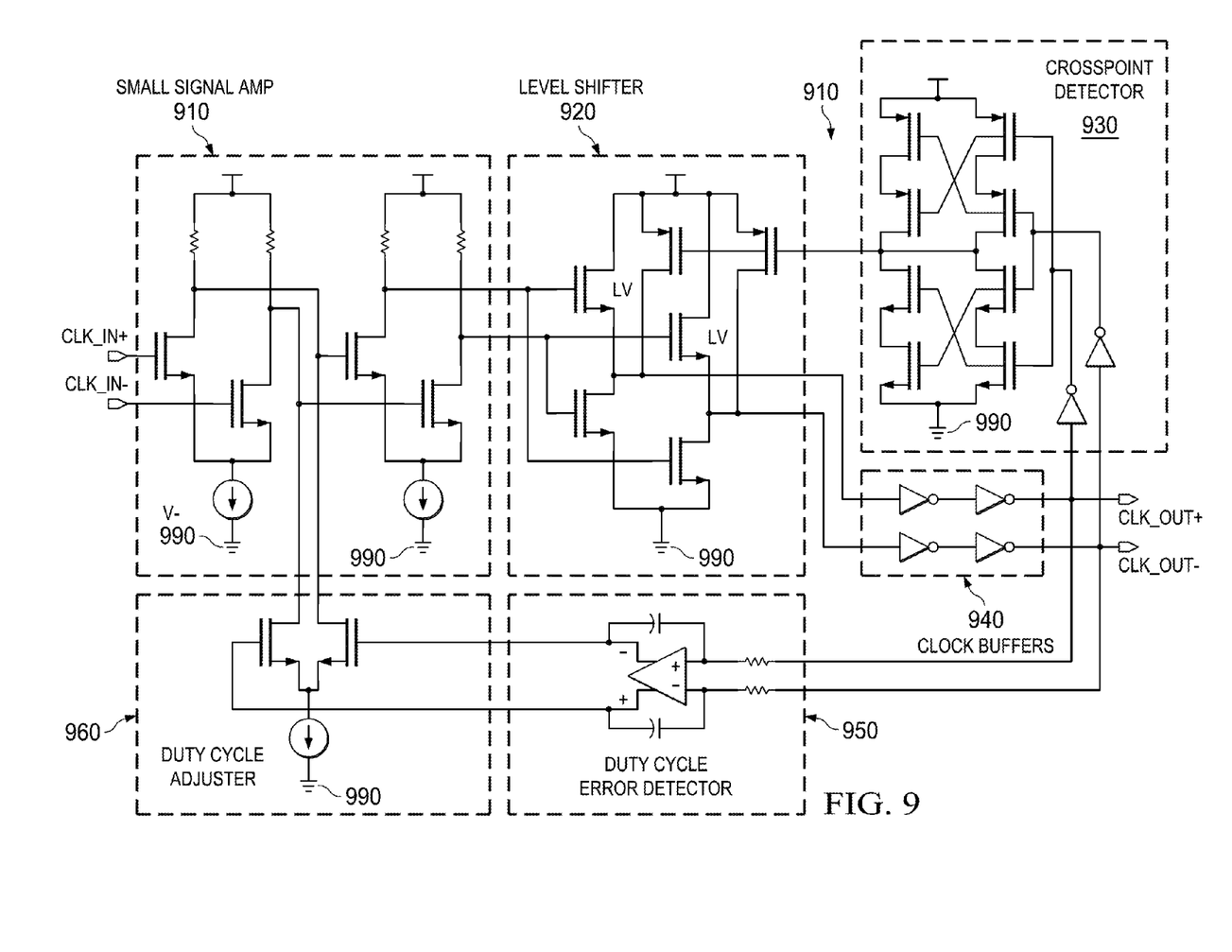
FIG. 9 is a block diagram of a clock receiver according to one or more examples of the present Specification.

FIG. 9 is an electrical block diagram of a clock receiver 110 according to one or more examples of the present Specification. Clock receiver 110 receives CLK_IN+ and CLK_IN− as differential clock inputs. Clock receiver 110 outputs a CLK_OUT+ and CLK_OUT− as a differential clock output. In some embodiments, CLK_OUT+ may correspond to clock +112 and CLK_OUT− may correspond to clock −114 of FIG. 1. It should be noted, however, that clock receiver 110 need not necessarily be used in a DAC 100 of FIG. 1 or DAC 200 of FIG. 2, but has many other uses.

In this configuration, clock receiver 110 includes a small signal amplifier 910, which receives CLK_IN+ and CLK_IN− as input signals. Small signal amplifier 910 also receives a duty cycle adjustment from duty cycle adjuster 1160. Small signal amplifier 910 is referenced to a V−990, which in this configuration may be a chassis ground or other similar ground. Small signal amplifier 910 amplifies the input clock CLK_IN+ and CLK_IN−, and corrects the duty cycle of the input clock according to the signal from duty cycle adjuster 960. Small signal amplifier 910 then provides the amplified clock signal to level shifter 920.

Level shifter 920 converts the output from small signal amplifier 910 to CMOS signals so that it can drive clock buffers 940. The cross point of level shifter 920 can adjusted by cross point detector 930. Crosspoint detector 930 monitors the crosspoint received from level shifter 920, and makes adjustments as necessary. Level shifter 920 also provides its output to clock buffers 940, which amplifies the clock signal to CLK_OUT+ and CLK_OUT−, which may correspond to differential clock signal 918. The output of clock buffers 940 is also provided in a feedback configuration to duty cycle error detector 950, which detects errors in the duty cycle provided by clock buffer 940, and provides the error to the duty cycle adjuster 960. It should be noted that cross point detector 930 and duty cycle error detector 950 are provided by way of example only, and will not be necessary in certain configurations. In particular, in the embodiment of DAC 200 of FIG. 2, they may be unnecessary because duty cycle error detection and cross point detection are provided within DAC 200. Thus, the disclosure of FIG. 9 may be modified in appropriate circumstances and according to design restraints.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES are applicable to any integrated circuits that involve signal processing (for example, gesture signal processing), particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

In the discussions of the embodiments above, the capacitors, buffers, interconnections, clocks, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended Claims. In order to assist the United States Patent and Trademark Office (USPTO) and, additionally, any readers of any patent issued on this application in interpreting the Claims appended hereto, Applicant wishes to note that the Applicant: (a) does not intend any of the appended Claims to invoke paragraph six (6) of 35 U.S.C. section 112 as it exists on the date of the filing hereof unless the words "means for" or "steps for" are specifically used in the particular Claims; and (b) does not intend, by any statement in the Specification, to limit this disclosure in any way that is not otherwise reflected in the appended Claims.

What is claimed is:

1. A digital-to-analog converter (DAC) comprising:
   a clock receiver operable to provide a distributed clock signal output and operable to adjust the distributed clock signal responsive to a feedback signal; and
   a DAC core operable to receive the distributed clock signal and to provide the distributed clock signal to a plurality of conversion cells, the DAC core comprising a clock error detection circuit operable to detect a crosspoint error in the distributed clock signal.

2. The DAC of claim 1, wherein the clock signal output is a differential clock signal.

3. The DAC of claim 1, wherein the DAC core further comprises a second error detection circuit operable to detect a of duty cycle error.

4. The DAC of claim 1, wherein the clock error detection circuit comprises:
   a first DAC replica cell comprising a first common source node operable to receive a direct current (DC) reference;
   a second DAC replica cell comprising a second common source node and operable to receive a data input; and
   a comparator operable to compare ripple on the first common source node to ripple on the second common source node and to provide therefrom a crosspoint error.

5. The DAC of claim 1, wherein the error detection circuit includes a substantial clone of one of the conversion cells.

6. The DAC of claim 5, wherein the substantial clone of one of the conversion cells comprises a binary DAC cell.

7. The DAC of claim 5, wherein:
   the conversion cells comprise a most-significant bit (MSB) region comprising a first species of conversion cell and a least-significant bit (LSB) region comprising a second species of conversion cell; and
   the error detection circuit includes a substantial clone of the first species of conversion cell.

8. The DAC of claim 7, wherein the first species of conversion cell comprises a thermometer DAC.

9. An integrated circuit comprising the DAC of claim 1.

10. A clock signal error detector comprising:
    an input for receiving a clock signal input;
    an error detection core circuit operable to detect a first species of error in the clock signal input; and
    an output for providing a clock correction signal;
    wherein the clock signal error detector is disposed within a data conversion core and comprises circuitry that is a substantial clone of a substantive data conversion circuit within the data conversion core.

11. The clock signal error detector of claim 10, wherein the error detection core circuit is operable to detect duty cycle errors.

12. The clock signal error detector of claim 10, wherein the error detection core circuit is operable to detect crosspoint errors.

13. The clock signal error detector of claim 12, wherein the error detection core circuit detects crosspoint errors indirectly by measuring ripple at a common source node.

14. A digital-to-analog converter (DAC) comprising:
    a clock receiver operable to provide a distributed clock signal output and operable to adjust the distributed clock signal responsive to a feedback signal; and
    a DAC core operable to receive the distributed clock signal and to provide the distributed clock signal to a plurality of conversion cells, the DAC core comprising a clock error detection circuit comprising a substantial clone of one of the conversion cells and operable to detect a first species of error in the distributed clock signal.

15. The DAC of claim 14, wherein the first species of error comprises duty cycle error.

16. The DAC of claim 14, wherein the first species of error comprises crosspoint error.

17. The DAC of claim 14, wherein the DAC core further comprises a second error detection circuit operable to detect a second species of error.

18. The DAC of claim 14, wherein the first species of error comprises duty cycle error, and wherein the second species of error comprises crosspoint error.

19. The DAC of claim 14, wherein the clock error detection circuit comprises:
    a first DAC replica cell comprising a first common source node operable to receive a direct current (DC) reference;
    a second DAC replica cell comprising a second common source node and operable to receive a data input; and
    a comparator operable to compare ripple on the first common source node to ripple on the second common source node and to provide therefrom a crosspoint error.

20. The DAC of claim 14, wherein the substantial clone of one of the conversion cells comprises a binary DAC cell.

21. The DAC of claim 14, wherein:
    the conversion cells comprise a most-significant bit (MSB) region comprising a first species of conversion cell and a least-significant bit (LSB) region comprising a second species of conversion cell; and
    the error detection circuit includes a substantial clone of the first species of conversion cell.

* * * * *